United States Patent [19]

Baker et al.

[11] Patent Number: 4,758,784
[45] Date of Patent: Jul. 19, 1988

[54] AIR CORE GAUGE WITH ZERO POINTER RETURN RELATED APPLICATION

[75] Inventors: John D. Baker, Naperville, Ill.; Ray J. Gallagher, Hot Springs Village, Ark.

[73] Assignee: Stewart Warner Corporation, Chicago, Ill.

[21] Appl. No.: 8,079

[22] Filed: Jan. 27, 1987

Related U.S. Application Data

[63] Continuation-in-part of Ser. No. 798,435, Nov. 15, 1985, abandoned.

[51] Int. Cl.[4] ............... G01R 1/20; G01R 11/02
[52] U.S. Cl. ........................ 324/146; 324/140 D
[58] Field of Search .......... 324/144, 146, 147, 151 R, 324/140 D; 340/870.38, 870.39

[56] References Cited

U.S. PATENT DOCUMENTS

| | | | |
|---|---|---|---|
| 1,783,851 | 12/1930 | McCoy | 324/140 R |
| 2,358,910 | 9/1944 | Degiers | 324/140 D |
| 2,425,366 | 8/1947 | Degiers | 324/140 D |
| 3,094,659 | 6/1963 | Pfeffer | 324/146 |
| 3,168,689 | 2/1965 | Gelenius | 324/146 |
| 3,460,038 | 8/1969 | Ziegler | 324/146 |
| 3,500,201 | 3/1970 | Mentzer | 324/146 |
| 3,624,625 | 11/1971 | Stonestreet | 324/144 |
| 3,713,024 | 1/1973 | Banus | 324/146 |
| 4,492,920 | 1/1985 | Reenstra | 324/146 |

*Primary Examiner*—Reinhard J. Eisenzopf
*Assistant Examiner*—Jose M. Solis
*Attorney, Agent, or Firm*—Lorusso & Loud

[57] ABSTRACT

An air core gauge having orthogonally related coils that react with a rotor magnet to angularly position an indicating pointer, suitable for use as either a pressure,- temperature, or fuel gauge. All-attitude pointer·zero return is achieved with a stationary magnet, and voltage regulation is eliminated with a zener diode in series with one of the coils.

17 Claims, 4 Drawing Sheets

AIR CORE GAUGE WITH ZERO POINTER RETURN RELATED APPLICATION

This application is a continuation-in-part of our co-pending U.S. patent application Ser. No. 798,435, filed Nov. 15, 1985, entitled AIR CORE GAUGE WITH ZERO POINTER RETURN, abandoned after the filing of this application.

BACKGROUND OF INVENTION

Air core gauges have achieved a considerable amount of commercial success over the past several decades basically because of their simplicity and the elimination of many of the mechanical parts associated with purely mechanical instrumentation. Air core gauges usually use a plurality of coils mounted at various angles with respect to one another that are energized in accordance with the value of a remote condition to provide a resultant magnetic field for rotating a magnet fixed to a pointer shaft. A pointer on the shaft is thus rotated to an angular position indicating the value of the sensed condition. These devices are frequently used as speedometers, tachometers, fuel gauges, pressure gauges, temperature gauges and voltmeters.

In some cases these air core gauges include two orthogonally positioned coils that are energized in such a way that the magnetic field produced by one coil increases while the other descreases in response to a changing signal from a remote condition until one coil is providing a maximum field in one direction, and the other a minimum field in the other direction. Under these circumstances the resultant magnetic field can be shifted 90 degrees permitting the same maximum theoretical pointer movement.

In another similar type of known air core gauge, two primary orthogonally related coils are provided in which the magnetic fields in both coils increase and decrease in response to the changing signal representing the sensed condition. In these instruments a third coil is positioned to provide a relatively fixed force in opposition to one of the primary field forces so that the summation of the three fields deflects the pointer magnet and pointer. The resultant magnetic field can be shifted 90 degrees and thereby provide 90 degrees of pointer movement.

Normally in such instruments the pointer returns to zero by gravity when the DC power supply is turned off. However, there are instances, such as present day military vehicular specifications, where a positive zero pointer return is required regardless of the attitude of the associated vehicle, i.e. vertical-horizontal-upside down, etc. Moreover, the same military specifications require instrument voltage regulation because supply voltage variation frequently will cause pointer movement and error.

It has been suggested in the part by Faria Corporation to provide a secondary fixed magnet adjacent the pointer rotor magnet aligned so it returns the pointer to zero when the supply is shut off. However, this gauge requires a voltage regulator to eliminate pointer movement with changes in supply voltage and also requires a transistor amplifier stage to increase the signal from a remote condition.

The Reenstra U.S. Pat. No. 4,492,920 shows the basic concept of compensating for the return biasing effect of a zero return magnet with an additional coil wound around the bobbin of a two coil air core gauge. This system requires an extra coil to effect compensation regardless of the number of driving coils.

It is a primary object of the present invention to provide an improved air core gauge with an all-attitude zero pointer return without the requirement for voltage regulation.

SUMMARY OF THE PRESENT INVENTION

In accordance with the present invention, an air core gauge is provided with zero pointer return and a steady pointer without voltage regulation, and generally includes two primary orthogonally related series connected coils responsive to a sensed condition such as fuel level or oil pressure, and a third coil producing a relatively constant magnetomotive force (mmf) that together provide a resultant mmf to drive an indicating pointer angularly proportional to the sensed condition.

An important aspect of the present invention is the provision of an all attitude zero pointer return stationary magnet and associated circuitry that act on a pointer rotor to return it to zero in the absence of a sender signal regardless of vehicle attitude, and that hold the pointer steady without requiring a regulated supply voltage. The elimination of voltage regulation greatly reduces the cost of the driving circuit, and gain stage oscillation is eliminated because the present circuit has no transistor amplifier stage, as in the above described Faria unit.

An unregulated supply, for example from between 20 and 30 volts, causes the mmf in the primary coils and in the third relatively fixed mmf coil to vary and would ordinarily cause unwanted pointer movement with battery changes because the effective mmf provided by the stationary magnet is constant regardless of supply change. However, so long as the forces acting on the pointer rotor are balanced, the rotor and pointer will remain fixed even though supply voltage and current flow through the coils caused thereby change. That is, so long as the ratio of the forces acting on the pointer rotor (including the three coil mmfs and the effective return magnet mmf) is constant, the pointer will remain stationary even through the magnitude of the forces changes. Of course, the problem then is that the magnitude of the return magnet force does not vary with supply voltage.

According to the present invention the direction of the effective return magnet mmf is positioned in alignment with and in the same direction as the mmf of the third relatively fixed mmf coil with both directed toward the zero pointer position. The pointer has 74 degree maximum deflection from this zero position. One of the primary coils is wound to produce an mmf aligned with but opposite the third coil and magnet mmfs, and the other primary coil is orthogonally positioned to produce a perpendicular mmf. The summation of these four mmfs deflects the pointer rotor.

To achieve this force balance on the rotor with changing supply, the sum of the third coil mmf and the effective magnet mmf increases and decreases in the same proportion with supply voltage change as the mmf produced by the primary coils. This is done with a zener diode in series with the third coil that provides a fixed voltage drop to the third coil and in effect exaggerates mmf changes in the third coil with supply compared to mmf changes in the primary coils to compensate for the non-changing magnet mmf. The net effect is that the forces acting on the pointer rotor remain in balance even though supply voltage varies.

The zener diode voltage required to achieve this force balance is equal to the product of the effective magnet mmf and battery voltage divided by the sum of the third coil mmf and effective return magnet mmf. Or stated otherwise, the ratio of the zener diode voltage to battery voltage is equal to the ratio of the effective magnet mmf and the sum of the third coil mmf and the effective magnet mmf.

This third coil also functions to temperature compensate for changes in mmf in the primary coils during −65 degree F. through 160 degrees F. temperature excursions. This is accomplished with a temperature compensating balco resistor in series with the third coil that has a positive temperature coefficient similar to the copper windings of the primary coils. Then the third coil winding tracks the resistance changes in the primary coils, and hence ampere turn values, during ambient temperature changes and thereby balances the forces on the pointer rotor.

In a second embodiment of the present invention, the zero return magnet is spaced apart from the coils and the rotor on a printed circuit board so the strength of the magnet can be changed during calibration by a closely coupled demagnetizing fixture without changing rotor magnetization.

DETAILED DESCRIPTION OF THE PREFERRED EMBODIMENT

Figure 1:
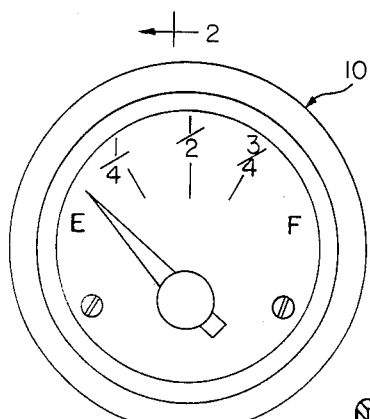
FIG. 1 is a front view of a fuel gauge according to the present invention.

Referring to the drawings and particularly FIGS. 1 to 7, an air core gauge 10 is illustrated according to the present invention and as can be seen takes the form of a fuel gauge, but it should be understood that the principles of the present invention can be applied to other instruments such as pressure gauges as well.

Gauge 10 generally includes a cup-shaped main housing 11 enclosed by a bezeled forward glass 12 containing a printed circuit board 14, a coil assembly 15, an instrument face dial 16 and a pointer 18 driven by the coil assembly 15.

Figure 2:
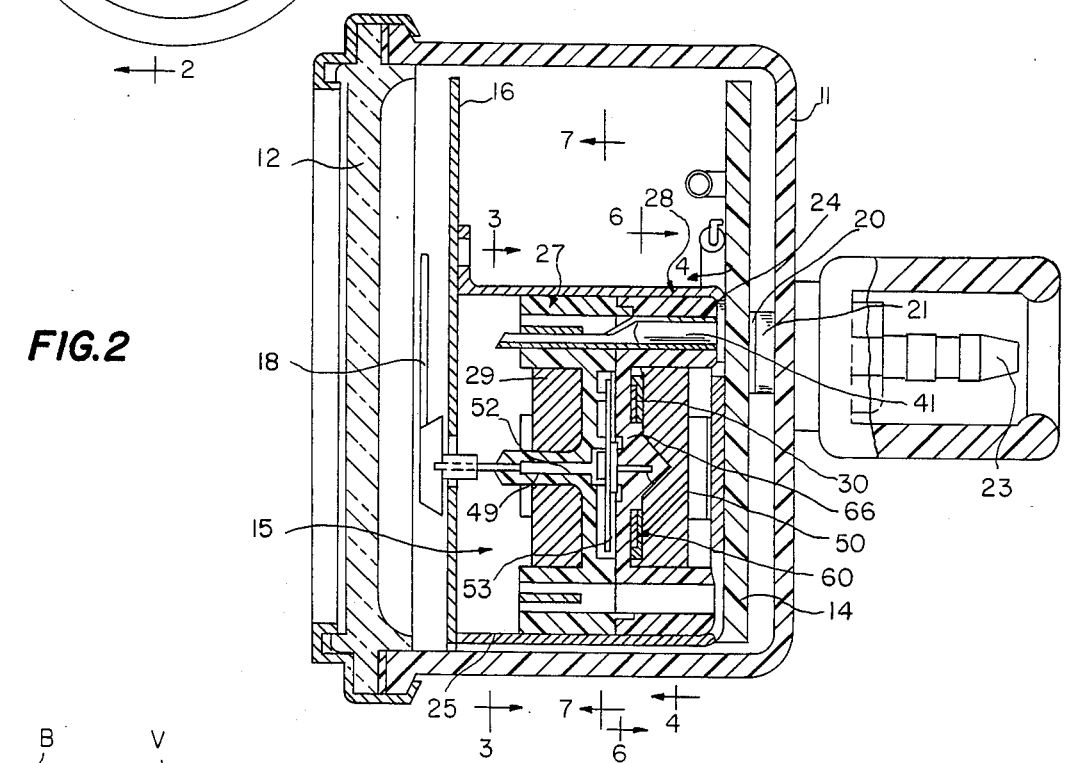
FIG. 2 is an enlarged longitudinal section of the gauge illustrated in FIG. 1 taken generally along line 2—2 of FIG. 1.
Figure 8:
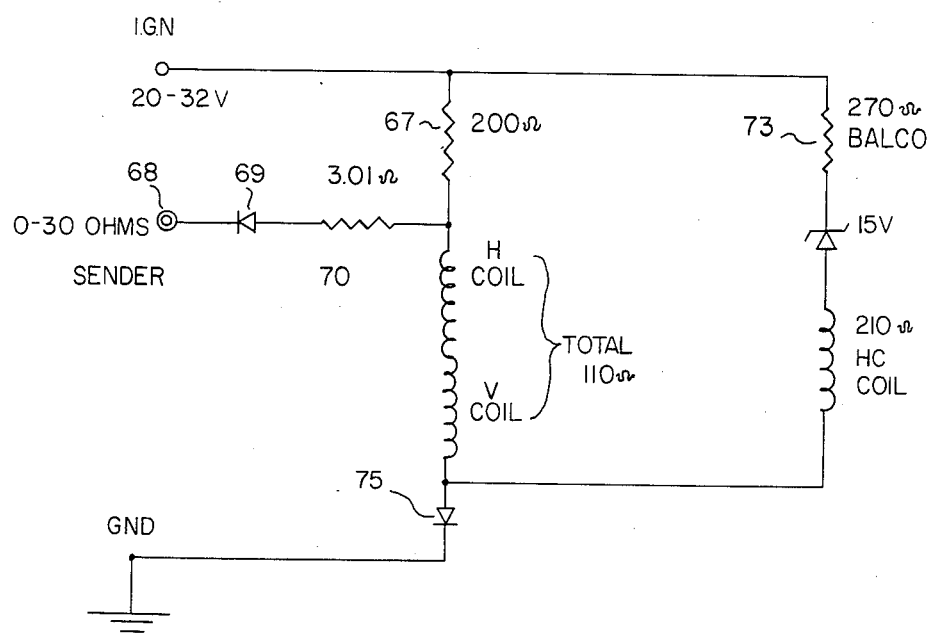
FIG. 8 is a schematic of the coil driving circuit incorporated into the present gauge.

As seen in FIG. 2, the printed circuit 14, which carries the circuitry illustrated in FIG. 8, is mounted in the rear of the housing 11 and has two spaced circular terminals 20 on the back surface thereof in engagement with aligned spaced terminals 21 in the bottom of the housing that are connected to spaced sender and ignition terminals 23 fixed to the housing 11 and extending rearwardly therefrom.

A cup-shaped metal magnetic shield 25 is mounted on the forward surface of the circuit board and houses the coil assemby 15. Coil assembly 15 includes interengaging plastic rotor housing members 27 and 28 having facing cup-shaped cylindrical central portions 29 and 30 with four equally spaced integral posts 32, 33, 34 and 35 (FIG. 3) and 37, 38, 39 and 40 (FIG. 4) respectively. Housing 27 has three insert molded metal sleeves 24 extending rearwardly from posts 32, 33 and 35 into complementary receiving apertures 45, 46 and 47 in the forward surfaces of posts 37, 38 and 40 in housing member 28 to secure the two housing members together in proper alignment. The housing members 27 and 28 are held against the lower surface of shield 25 by three pins 41, 42 and 43 that are fixed to the circuit board 14 and project forwardly therefrom and are press-fitted in the sleeves 24 in the housing member posts 37, 38 and 40.

The housing members 27 and 28 have central bores 49 and 50 therein that rotatably support a pointer shaft 52 that carries a magnetized rotor disc 53. The projecting end of the rotor shaft 52 carries pointer 18. The face dial 16 has fasteners 54 (FIG. 5) extending therethrough that engage in bosses 57 and 58 that project forwardly and integrally from the bottom of the cup-shaped housing 11, and this locates the dial and also serves to clamp the shield 25 against the circuit board 20 to assist the pins 41, 42 and 43 in holding the assembly together.

Figure 3:
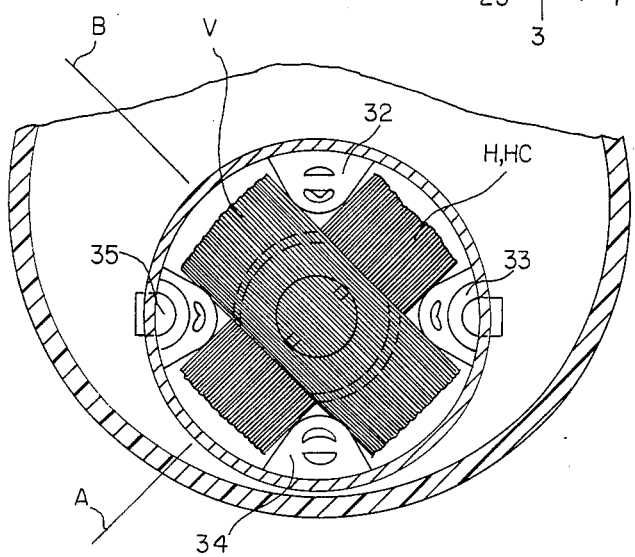
FIG. 3 is a front view of the coil assembly taken generally along line 3—3 of FIG. 2.
Figure 5:
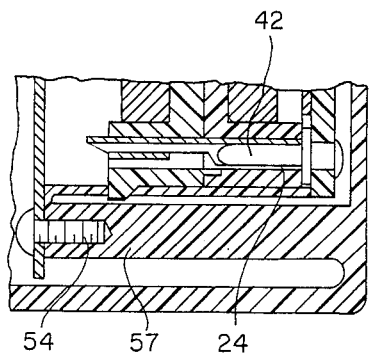
FIG. 5 is a fragmentary longitudinal section taken generally along line 5—5 of FIG. 4.
Figure 4:
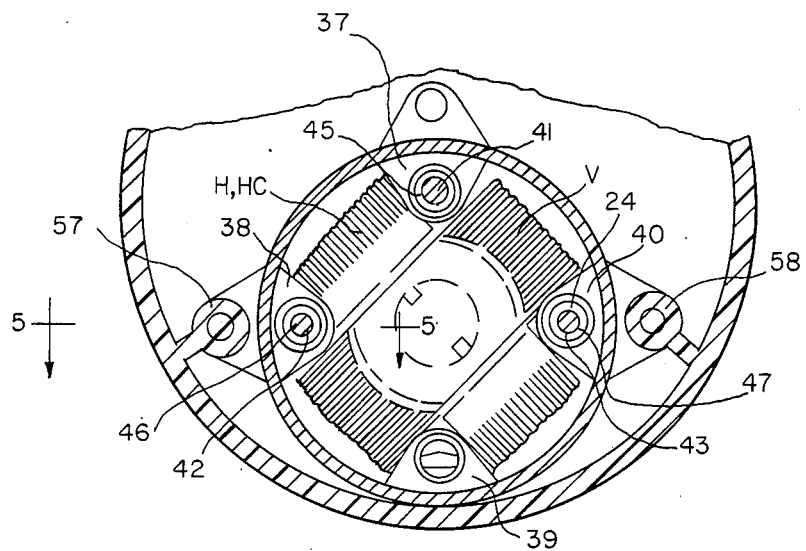
FIG. 4 is a rear view of the coil assembly taken generally along line 4—4 of FIG. 2.

The three operating coils for the present gauge are wound around the rotor housing members 27 and 28 between the integral posts and as may be seen in FIGS. 3 and 4 are generally orthogonally related. A primary coil H has 1000 turns and is wound on axis A, and second primary coil V is wound on top of coil H using the same wire uninterrupted on axis B, the latter having 600 turns. Coils H and V are thus electrically in series as seen in FIG. 8. A third coil HC, electrically in parallel with coils H and V as seen in FIG. 8, is wound on axis A over coil H and it has 600 turns. Coil HC is wound and connected so that the mmf produced thereby opposes the mmf produced by coil H. With coil assembly 15 positioned as shown with respect to face dial 16, the mmf produced by coil HC is toward and in alignment with the minimum pointer position and the H coil mmf is opposite thereto, and the V coil mmf is orthogonally related to both the H and HC mmfs as represented in the vector diagrams in FIGS. 9 through 12.

Figure 6:
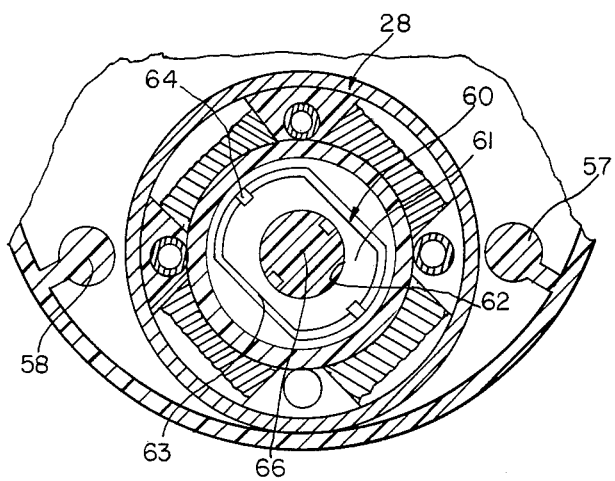
FIG. 6 is a cross-section taken generally along line 6—6 of FIG. 2 illustrating the stationary magnet assembly.
Figure 7:
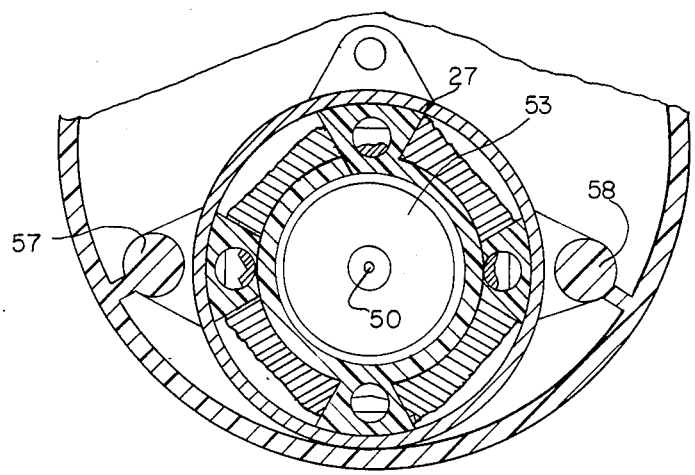
FIG. 7 is a cross-section taken generally along line 7—7 of FIG. 2 illustrating the pointer rotor.

As seen in FIGS. 2 and 6, a magnet and holder assembly 60 is provided mounted on the rear surface of rotor housing member 28 in a position to rotate the pointer 18 with supply off to its zero or empty position regardless of vehicle attitude. Magnet assembly 60 includes a magnetized steel permanent magnet washer 61 with flat sides and a central opening 62 surrounded by a plastic holder 63 that has tabs 64 for holding the washer 61 in the holder and diametral tabs 65 that fit tightly in complementary recesses in the back of the rotor housing 28 to hold the magnet assembly on a central cylindrical boss 66 on the rear of the housing member 28.

Magnet assembly 60 is positioned on the rear of the housing member 28 in the position illustrated in FIGS. 3 and 4 with its axis in alignment with the zero pointer direction. Magnet 61 and rotor 53 are magnetized simultaneously and then with the pointer shaft located in the preferred direction of magnet 61, pointer 18 is assembled to its minimum or zero position. Magnet 61 is also initially magnetized with approximately 20 percent greater magnetization than required and thereafter it is treated with a gradually increasing reverse flux to decrease its magnetic strength during calibration allowing the pointer 18 to deflect to exactly 74 degrees or full scale with 30 ohms at sender terminal 23. The rotor magnet 53 is not reduced in strength since treating is done with the DC power off and it rotates to the zero position. This reverse flux treatment of the permanent magnet during calibration also compensates for tolerances in the electrical components on printed circuit board 14.

Viewing FIG. 8, the present circuit has an unregulated supply of 20 to 32 volts that supplies current across a dropping resistor 67 to the H and V coils which as noted above are series-connected, and have a total impedance of 110 ohms.

Sender 68 is a variable zero is thirty ohm resistor with low impedance at zero pointer deflection and essentially shunts coils H and V to cause upscale movement of pointer 18. Diode 69 provides battery reversal protection and a 3.01 ohm resistor 70 improves linearity at the 0, 15 and 30 ohm marks of the sender 68.

The HC coil, in parallel with coils H and V, provides an mmf that is substantially fixed except for changes in supply voltage and temperature. A 15 volt zener diode 71 is in series with the HC coil and provides the fixed voltage drop necessary to offset, with changes in supply, the effective constant mmf provided by the permanent magnet 61.

The voltage drop provided by zener diode 71 is determined by the following formula:

$$V_z = \frac{H_m V_b}{HC + H_m}, \qquad (1)$$

where
$V_z$ = zener diode voltage
$V_b$ = battery voltage
HC = third coil mmf
$H_m$ = stationary magnet mmf Essentially, this formula expresses the ratio of the zener diode voltage to supply voltage as being equal to the ratio of the stationary magnet 61 mmf to the sum of the HC coil mmf and effective magnet mmf.

A balco resistor 73 is also in series with the HC coil and it serves to vary current flow in the coil HC to compensate for changes in current flow in coils H and V due to temperature changes. Toward this end resistor 73 is a temperature compensating resistor and has a positive temperature coefficient similar to the copper windings of coils H and V so that the HC winding tracks resistance changes of coils H and V during ambient temperature changes and maintains a balanced force condition acting on the pointer rotor 53 with changes in temperature.

Figure 9:
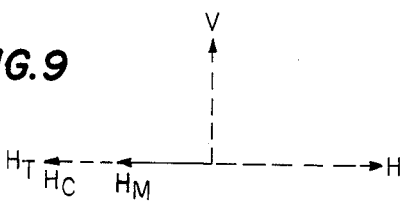
FIG. 9 is a vector diagram of mmfs with DC power off.
Figure 10:
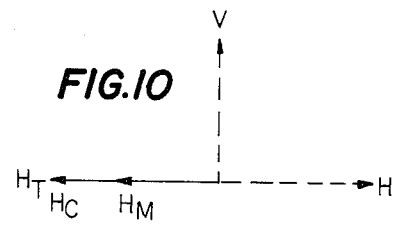
FIG. 10 is a vector diagram with DC power on and zero sender resistance.

Viewing FIG. 9, when the sensed condition is at zero, and with DC supply off, only the stationary magnet mmf $H_m$ acts on the rotor 53 driving the pointer to its zero indicating position. With the application of supply and as indicated in FIG. 10, both the HC coil mmf and the effective mmf of the magnet, which are aligned and additive to one another, drive rotor and pointer to their zero positions. Vector HT in FIGS. 9 to 13 represents the sum of the vectors HC and $H_m$. No current flows at this time in either the H or the V coils if we neglect the low value resistor 70. Both diode 69 and diode 75 have equivalent voltage drop. The HC coil at this time does have a flux value because current flows from the battery through the temperature compensating resistor 73 and zener diode 71.

Figure 11:
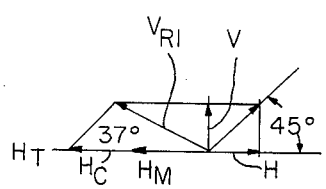
FIG. 11 is a vector diagram with 15 ohms sender resistance and one-half maximum pointer deflection.
Figure 12:
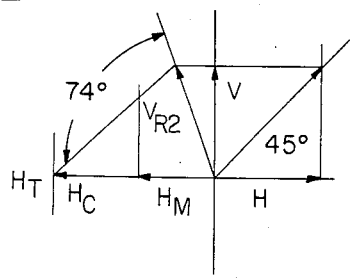
FIG. 12 is a vector diagram with 30 ohms sender resistance and maximum pointer deflection.

As sender impedance rises to 15 ohms (one-half its maximum value) current flow increases equally through coils H and V providing increasing mmf in both represented by the vectors H and V illustrsated in FIG. 11 that when vectorally added with the vectoral sum of the HC coil mmf and the effective magnetic mmf provide a resultant mmf vector $V_{R1}$ that has a 37 degree angle with the HC vector causing the pointer to deflect 37 degrees from zero, which is one-half full scale deflection. With the sender 68 at maximum impedance, 30 ohms, current flow and mmf in both H and V coils will increase proportionally while the sum of the mmfs of the HC coil and magnet remains the same producing a resultant mmf and vector $V_{R2}$ angularly positioned 74 degrees clockwise from the HT vector. This resultant mmf drives the pointer to full scale 74 degree deflection illustrated in FIG. 1.

As noted above the HT mmf is the sum of the HC mmf and the effective mmf of the magnet. According to the present invention, the ratio of the H, V and HT mmfs remains constant with changes in supply voltage. So long as this ratio of the mmfs remains the same, the angle of the resultant mmf remains constant, even though the magnitude of the mmfs may vary.

Figure 13:
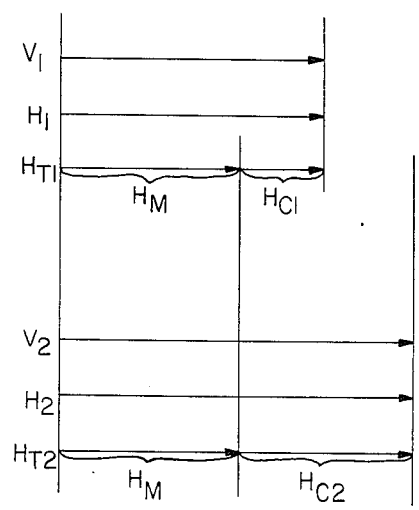
FIG. 13 is a vector diagram illustrating changes in the force vectors acting on the rotor with changes in supply voltage.

Viewing FIG. 13, these vector diagrams illustrate that the change in the HT mmf with change in supply voltage is proportionate to the change in the V and H mmfs with the same change in supply voltage. It should be understood that while the vectors V, H and HT are illustrated in FIG. 13 as being equal in magnitude, they are shown this way for purposes of clarity only and in fact, these vectors are unequal. FIG. 13 illustrates only that the change in the HT vector with supply voltage change in terms of percentage change is equal to the percentage change in the V and H vectors.

The upper vectors shown in FIG. 13 represent mmfs at 20 volts supply, and the lower vectors represent mmfs produced by a relatively high voltage, for example 30 volts. Let it be assumed that the effective mmf of the magnet $H_m$ is equal to three times the $HC_1$ coil mmf at 20 volts supply. Now when the supply voltage increases to 30 volts ($V_2$), the mmf in the H coil, $H_2$, will increase by 50 percent or a multiple of 1.5. Neglecting the effect of resistor 73, the voltage drop across the HC coil at 20 volts is 5 volts and its voltage drop at 30 volts supply is 15 volts because of the 15 volt zener diode and thus the HC coil mmf increases 300 percent or a multiple of 3.0. Since the assumed magnet mmf is three times the mmf $HC_1$, then $HT_1$ equals $4HC_1$, and $HT_2$ equals $6HC_1$, and thus is 50 percent greater than $HT_1$ or a multiple of 1.5, the same as the H and V coils increase.

Therefore, the ratio of the forces remains the same. This same relationship holds true for any supply voltage change so long as the ratio of the zener diode voltage to the battery voltage is equal to the ratio of the effective magnet mmf to the sum of the HC coil mmf and the effective magnet mmf.

In another example assume supply voltage increases from 20 to 25 volts, then current flow and mmf in the H and V coils will increase by 25 percent or by a multiple of 1.25 and the mmf in the HC coil will increase by 200 percent or a multiple of 2.0. That is, $HC_1 \approx V_{b1} - V_z = 20 - 15 = 5$, and $HC_2 \approx V_{b2} - V_z = 25 - 15 = 10$.

Then assuming again that magnet mmf is three times HC coil mmf at 20 V supply, the total:

$$HT_1 = 3\ HC_1\ \text{(magnet mmf)} + HC_1 = 4\ HC_1$$

and $$HT_2 = 3\ HCL_1\ \text{(magnet mmf)} + 2\ HC_1 = 5\ HC_1$$

or a 25 percent increase for a multiple of 1.25. Thus, in both examples the HT vector has increased by the same percentage as the V and H vectors and therefore the forces remain balanced on the rotor 53 and the pointer remains steady with changes in supply voltage. Substituting in equation (1) for the zener diode voltage value when the equivalent magnet mmf $H_m$ is equal to three times the HC coil mmf at 20 volt supply, we find;

$$V_z = \frac{3HC_1 \times 20\ V}{4HC_1} = \frac{60HC_1V}{4HC_1} = 15\ V,$$

which of course, is the value of zener diode voltage in the example given.

Figure 14:
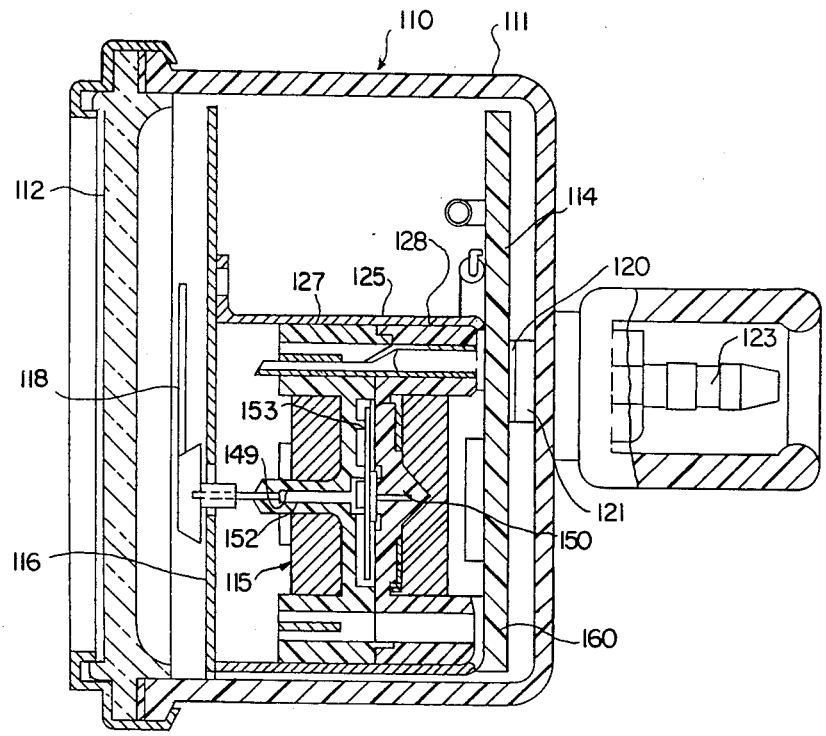
FIG. 14 is a longitudinal section of another embodiment of the present gauge.
Figure 15:
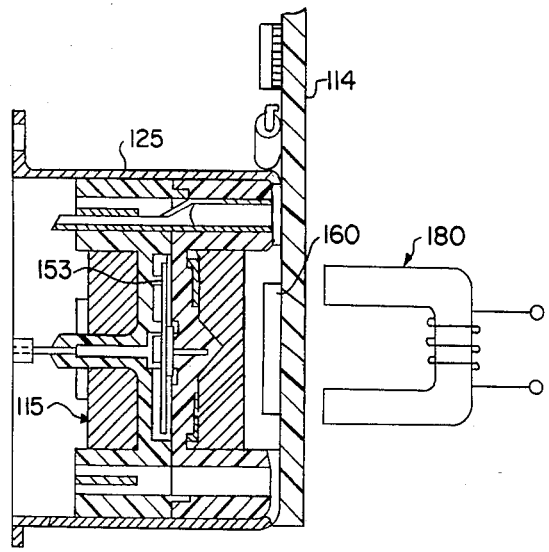
FIG. 15 is a longitudinal section of a subassembly of the gauge shown in FIG. 14 with a coupled demagnetizing fixture.

Referring to FIGS. 14 and 15, a modified form of the present invention is illustrated, particularly air core gauge 110 that is designed to be more easily calibrated than the gauge illustrated in FIGS. 1 to 7. It should be understood, however, that the principles of the zero return magnet and the method of offsetting the effect of the permanent magnet remain the same in this embodiment.

Gauge 110 generally includes a cup-shaped main housing 111 enclosed by a bezeled forward glass 112 containing a printed circuit board 114, a coil assembly 115, an instrument face dial 116 and a pointer 118 driven by the coil assembly 115.

The printed circuit 114, which also carries the circuitry illustrated in FIG. 8, is mounted in the rear of the housing 111 and has two spaced circular terminals 120 on the back surface thereof in engagement with aligned spaced terminals 121 in the bottom of the housing that are connected to spaced sender and ignition terminals 123 fixed to the housing 111 and extending rearwardly therefrom.

A cup-shaped metal magnetic shield 125 is mounted on the forward surface of the circuit board and houses the coil assembly 115. Coil assembly 115 includes inter-engaging plastic rotor housing members 127 and 128 identical to housing members 27 and 28 in the FIGS. 1 to 7 embodiment.

The housing members 127 and 128 have central bores 129 and 150 therein that rotatably support a pointer shaft 152 that carries a magnetized rotor disc 153. The projecting end of the rotor shaft 152 carries pointer 118.

The three operating coils for the gauge 118 are wound around the rotor housing members 127 and 128 between the integral posts and are generally orthogonally related and include primary coil H with 1000 turns, a second primary coil V wound on top of coil H using the same wire uninterrupted, and a third coil HC, electrically in parallel with coils H and V wound over coil H all in the same manner as described above with respect to the FIGS. 1 to 7 embodiment.

A magnet 160 is mounted on the forward surface of circuit board 114 and projects through the open bottom of shield 125 in a position to rotate the pointer 118 with supply off to its zero or empty position regardless of vehicle attitude. Magnet 160 is a circular permanent magnet washer bonded to the face of the circuit board and is substantially larger than washer magnet 61. As seen in FIGS. 14 and 15, magnet 160 is spaced a substantial distance away from the coils and the rotor 153.

Magnet 160 is positioned on the circuit board with its flux axis in alignment with the zero pointer direction.

In the FIGS. 14 and 15 embodiment, the larger permanent magnet is premagnetized separately from the rotor 153, rather than simultaneously as in the first embodiment, to a strength above the desired final value. Full DC power (30 ohms at the coil input) is applied to the gauge during calibration to deflect the pointer to $\frac{2}{3}$rd or $\frac{3}{4}$ths of full scale, and then permanent magnet 160 is treated with a gradually increasing reverse flux by a demagnetizing coil fixture 180 to decrease the magnetic strength of the permanent magnet and move the pointer 118 toward its full scale position, and at full scale the reverse flux is shut off.

Because the demagnetizing fixture 180 is tightly coupled to the permanent magnet 160 and because the permanent magnet is spaced significantly further from the rotor 153 than in the FIGS. 1 to 7 embodiment, the magnetization of the rotor 153 remains unaffected by the demagnetizing fixture 180 during calibration. This method of calibration increases calibration rate in production.

We claim:

1. An air core gauge for driving a mechanical indicator proportionally to the value of a remote condition, comprising: at least two angularly related coils, input signal means responsive to the remote condition for varying the current flow through the coils and the resulting mmfs to drive a mechanical indicator from a zero position to a maximum value position, fixed force means for continuously biasing the indicator toward its zero position continuously generally in force and directional alignment with the mmf of one of the coils, an unregulated supply voltage for the coils that varies the current in the coils, and fixed voltage drop means in series with said one coil so the coil mmfs and the fixed force means acting on the indicator remain balanced with changes in supply voltage, said fixed force means biasing the indicator toward its zero position with supply voltage applied to the coils.

2. An air core gauge for driving a mechanical indicator proportionally to the value of a remote condition, comprising: at least two angularly related coils, input signal means responsive to the remote condition for varying the current flow through the coils and the resulting mmfs to drive a mechanical indicator from a zero position to a maximum value position, fixed force means for continuously biasing the indicator toward its zero position, generally in force and directional alignment with the mmf of one of the coils, a variable supply voltage for the coils that varies the current in the coils, and fixed voltage drop means in series with said one coil so that changes in supply voltage cause a greater change in flux in said one coil than the other coil, said fixed force means biasing the indicator toward its zero position with supply voltage applied to the coils.

3. An air core gauge as defined in claim 1, wherein said coils include orthogonally related first and second coils and a third coil aligned with the first coil and producing an mmf opposite the mmf produced by the first coil, said first and second coils producing mmfs that both vary proportionally with the input signal means and said third coil producing an mmf independent of the input signal means, said fixed force means acting in the same direction as the mmf produced by the third coil, said fixed voltage drop means being in series with the third coil so the mmf produced by the third coil varies more with supply voltage change than the mmfs produced by the first and second coils to balance forces acting on the indicator so the direction of the resultant mmf of the three coils and the fixed force means is unaffected by changes in supply voltage.

4. An air core gauge as defined in claim 1, wherein the indicator is a rotary pointer having a magnetic rotor connected thereto, said fixed force means being a permanent magnet adjacent and acting on the rotor to bias the pointer continuously toward its zero position.

5. An air core gauge as defined in claim 1, wherein the fixed voltage means is a zener diode in series with said one coil.

6. An air core gauge as defined in claim 3, wherein the first and second coils are in series and the third coil is parallel to the first and second coils, said voltage drop means being a zener diode in series with the third coil.

7. An air core gauge for driving an indicator pointer to an angular position proportionally to the value of a sensed condition, comprising: first and second orthogonally related coils producing orthogonal mmfs acting on the pointer that vary in magnitude with the sensed condition, a third coil positioned to produce an mmf acting on the pointer aligned with and opposing the mmf of the first coil, said third coil being unresponsive to variations in the sensed condition, an unregulated supply voltage for the first, second and third coils, whereby changes in supply voltage produce changes in current in all three coils, means for biasing the pointer toward a minimum indicating position including a constant return force acting on the pointer that is constant with changes in supply voltage, and a fixed voltage drop device in series with the third coil to offset the effect of the constant return force acting on the pointer.

8. An air core gauge as defined in claim 7, wherein the means for biasing the pointer toward a minimum indicating position includes a rotor magnet connected to the pointer and a stationary magnet adjacent the permanent magnet with its preferred flux lines aligned with the minimum indicating position of the pointer.

9. An air core gauge as defined in claim 7, wherein the fixed voltage drop device is a zener diode.

10. An air core gauge as defined in claim 7, including a temperature compensating resistor in series with the third coil to offset the effect of temperature changes on the first and second coils.

11. An air core gauge for driving an indicator pointer to an angular position proportionally to the value of a sensed condition, comprising: first and second orthogonally related coils producing orthogonal mmfs acting on the pointer that vary in magnitude with the sensed condition, a third coil positioned to produce an mmf acting on the pointer aligned with and opposing the mmf of the first coil, said third coil being unresponsive to variations in the sensed condition, an unregulated supply voltage for the first, second and third coils whereby changes in supply voltage produce changes in current in all three coils, a magnetized rotor fixed with respect to the pointer, a stationary magnet adjacent the pointer rotor positioned so that its preferred flux lines bias the rotor and pointer toward a pointer minimum indicating position, and a zener diode in series with the third coil to offset the biasing effect of the stationary magnet acting on the rotor, said zener diode having a fixed voltage drop according to the equation:

$$V_z = \frac{H_m V_b}{HC + H_m}$$

where
$V_z$ = zener diode voltage,
$V_b$ = battery voltage,
$HC$ = third coil mmf, and
$H_m$ = stationary magnet mmf.

12. An air core gauge for driving a mechanical indicator proportionally to the value of a remote condition, comprising: two angularly related coils, input signal means responsive to the remote condition for varying the current flow through the coils and the resulting mmfs to drive a mechanical indicator from a zero position to a maximum value position, fixed force means for continuously providing a force on the indicator in a first direction to bias the indicator toward its zero position, a compensating coil for the fixed force means that produces a force on the indicator in the same first direction as the first force means so that said fixed force means and said compensating coil bias the indicator to its zero position with supply voltage applied to the coils with no input signal present.

13. An air core gauge for driving a mechanical indicator proportionally to the value of a remote condition, comprising: a magnetic rotor, at least two angularly related coils surrounding the rotor, input signal means responsive to the remote condition for varying the current flow through the coils and the resulting mmfs to drive a mechanical indicator connected to the rotor from a zero position to a maximum value position, fixed force means for continuously biasing the indicator toward its zero position generally in force and directional alignment with the mmf of one of the coils, said fixed force means being spaced axially a substantial distance from both the coils and the rotor on the side of the coils opposite the rotor and the indicator so that the force of the fixed force means can be varied during gauge calibration without affecting the magnetic rotor.

14. An air core gauge for driving a mechanical indicator proportionally to the value of a remote condition, as defined in claim 13, wherein the fixed force means is a permanent magnet, and flux varying means for changing the strength of the permanent support during gauge calibration without changing the strength of the magnetic rotor.

15. An air core gauge for driving an indicator pointer to an angular position proportionally to the value of a sensed condition, as defined in claim 13, including a printed circuit board mounted adjacent but spaced from the coils and the rotor, said fixed force means including a permanent magnet mounted on the printed circuit board.

16. An air core gauge for driving a mechanical indicator proportionally to the value of a remote condition, comprising: a magnetic rotor, two angular related rotor driving coils surrounding the rotor providing mmfs in first and second orthogonally related directions, input signal means responsive to the remote condition for varying the current flow through the coils substantially equally to produce resulting mmfs to drive a mechanical indicator connected to the rotor from a zero position to a maximum value position, a third coil producing a substantially constant mmf aligned oppositely in one of the first and second directions, fixed force means for continuously producing a force in the opposite direction of one of the angularly related coils and in the same direction as the third coil mmf to bias the indicator toward its zero position, the strength of the third coil being selected to compensate for the fixed force means without a separate compensating coil.

17. An air core gauge as defined in claim 16, wherein the fixed force means is a permanent magnet.

* * * * *